US012805274B2

(12) United States Patent
Yang et al.

(10) Patent No.: US 12,805,274 B2
(45) Date of Patent: Nov. 17, 2026

(54) SEMICONDUCTOR DEVICE AND MANUFACTURING METHOD THEREOF

(71) Applicant: UNITED MICROELECTRONICS CORP., Hsin-Chu City (TW)

(72) Inventors: Chin-Chia Yang, Tainan City (TW); Da-Jun Lin, Kaohsiung City (TW); Fu-Yu Tsai, Tainan City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 335 days.

(21) Appl. No.: 18/660,223

(22) Filed: May 9, 2024

(65) Prior Publication Data

US 2025/0316621 A1 Oct. 9, 2025

(30) Foreign Application Priority Data

Apr. 3, 2024 (CN) ......................... 202410400083.7

(51) Int. Cl.

| | |
|---|---|
| ***H10P 95/00*** | (2026.01) |
| ***H10P 14/60*** | (2026.01) |
| ***H10W 20/00*** | (2026.01) |
| ***H10W 72/00*** | (2026.01) |
| *H10W 72/90* | (2026.01) |

(52) U.S. Cl.

CPC ........ *H10P 95/062* (2026.01); *H10P 14/6336* (2026.01); *H10W 20/074* (2026.01); *H10W 20/098* (2026.01); *H10W 72/019* (2026.01); *H10W 72/932* (2026.01)

(58) Field of Classification Search

CPC .............. H10P 95/062; H10P 14/6336; H10W 20/074; H10W 20/098; H10W 72/019; H10W 72/932

See application file for complete search history.

(56) References Cited

U.S. PATENT DOCUMENTS

| | | | | |
|---|---|---|---|---|
| 5,494,854 A | | 2/1996 | Jain | |
| 5,858,870 A | * | 1/1999 | Zheng | H10P 14/662 438/692 |
| 5,968,610 A | | 10/1999 | Liu | |
| 6,291,331 B1 | * | 9/2001 | Wang | H10W 20/071 438/618 |

(Continued)

*Primary Examiner* — Andres Munoz

(74) *Attorney, Agent, or Firm* — Winston Hsu

(57) ABSTRACT

A semiconductor device includes a semiconductor substrate, pad structures, a filling dielectric layer, a first compressive stress layer, and a second compressive stress layer. The pad structures are disposed on the semiconductor substrate. The filling dielectric layer is disposed on the semiconductor substrate and covers the pad structures. The filling dielectric layer includes a first portion and a second portion. The first portion is disposed between the pad structures in a horizontal direction. The second portion is disposed above the pad structures in a vertical direction. The first compressive stress layer is disposed on the first portion. A top surface of the first compressive stress layer and a top surface of the second portion are coplanar. The second compressive stress layer is disposed on the first compressive stress layer and the second portion. A thickness of the second compressive stress layer is greater than a thickness of the second portion.

19 Claims, 5 Drawing Sheets

(56) References Cited

U.S. PATENT DOCUMENTS

| | | | | |
|---|---|---|---|---|
| 8,865,508 | B2 | 10/2014 | Park | |
| 2008/0124940 | A1* | 5/2008 | Yu | H10W 20/098<br>438/762 |

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a compressive stress layer and a manufacturing method thereof.

2. Description of the Prior Art

Integrated circuit manufacturing process technology has been continuously improved with the advancement of science and technology for enabling various electronic circuits to be integrated and/or formed on a single chip. The semiconductor process for manufacturing wafers includes many steps, such as a deposition process to form a thin film, a photoresist coating to form a patterned photoresist, an exposure and development process, and an etching process to pattern the thin film. During the processes, warpage may occur in the wafer due to the process conditions (such as but not limited to high temperature) and/or the materials with different characteristics formed and stacked on the wafer. The operation of components on the wafer and/or the related process yield will be affected when the warpage issue is too serious.

SUMMARY OF THE INVENTION

A semiconductor device and a manufacturing method thereof are provided in the present invention. Two compressive stress layers are disposed for improving a warpage issue of the semiconductor device.

According to an embodiment of the present invention, a semiconductor device is provided. The semiconductor device includes a semiconductor substrate, pad structures, a filling dielectric layer, a first compressive stress layer, and a second compressive stress layer. The pad structures are disposed on the semiconductor substrate. The filling dielectric layer is disposed on the semiconductor substrate, and the filling dielectric layer covers the pad structures. The filling dielectric layer includes a first portion and a second portion. The first portion is disposed between the pad structures in a horizontal direction, and the second portion is disposed above the pad structures in a vertical direction. The first compressive stress layer is disposed on the first portion of the filling dielectric layer, and a top surface of the first compressive stress layer and a top surface of the second portion of the filling dielectric layer are coplanar. The second compressive stress layer is disposed on the first compressive stress layer and the second portion of the filling dielectric layer. A thickness of the second compressive stress layer is greater than a thickness of the second portion of the filling dielectric layer.

According to an embodiment of the present invention, a manufacturing method of a semiconductor device is provided. The manufacturing method includes the following steps. A semiconductor substrate is provided. Pad structures are formed on the semiconductor substrate. A filling dielectric layer and a first compressive stress layer are formed on the semiconductor substrate. The filling dielectric layer covers the pad structures, and the filling dielectric layer includes a first portion and a second portion. The first portion is disposed between the pad structures in a horizontal direction, and the second portion is disposed above the pad structures in a vertical direction. The first compressive stress layer is located on the first portion of the filling dielectric layer, and a top surface of the first compressive stress layer and a top surface of the second portion of the filling dielectric layer are coplanar. A second compressive stress layer is formed on the first compressive stress layer and the second portion of the filling dielectric layer. A thickness of the second compressive stress layer is greater than a thickness of the second portion of the filling dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms “on,” “above,” and “over” used herein should be interpreted in the broadest manner such that “on” not only means “directly on” something but also includes the meaning of “on” something with an intermediate feature or a layer therebetween, and that “above” or “over” not only means the meaning of “above” or “over” something but can also include the meaning it is “above” or “over” something with no intermediate feature or layer therebetween (i.e., directly on something).

The ordinal numbers, such as “first”, “second”, etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term “forming” or the term “disposing” are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
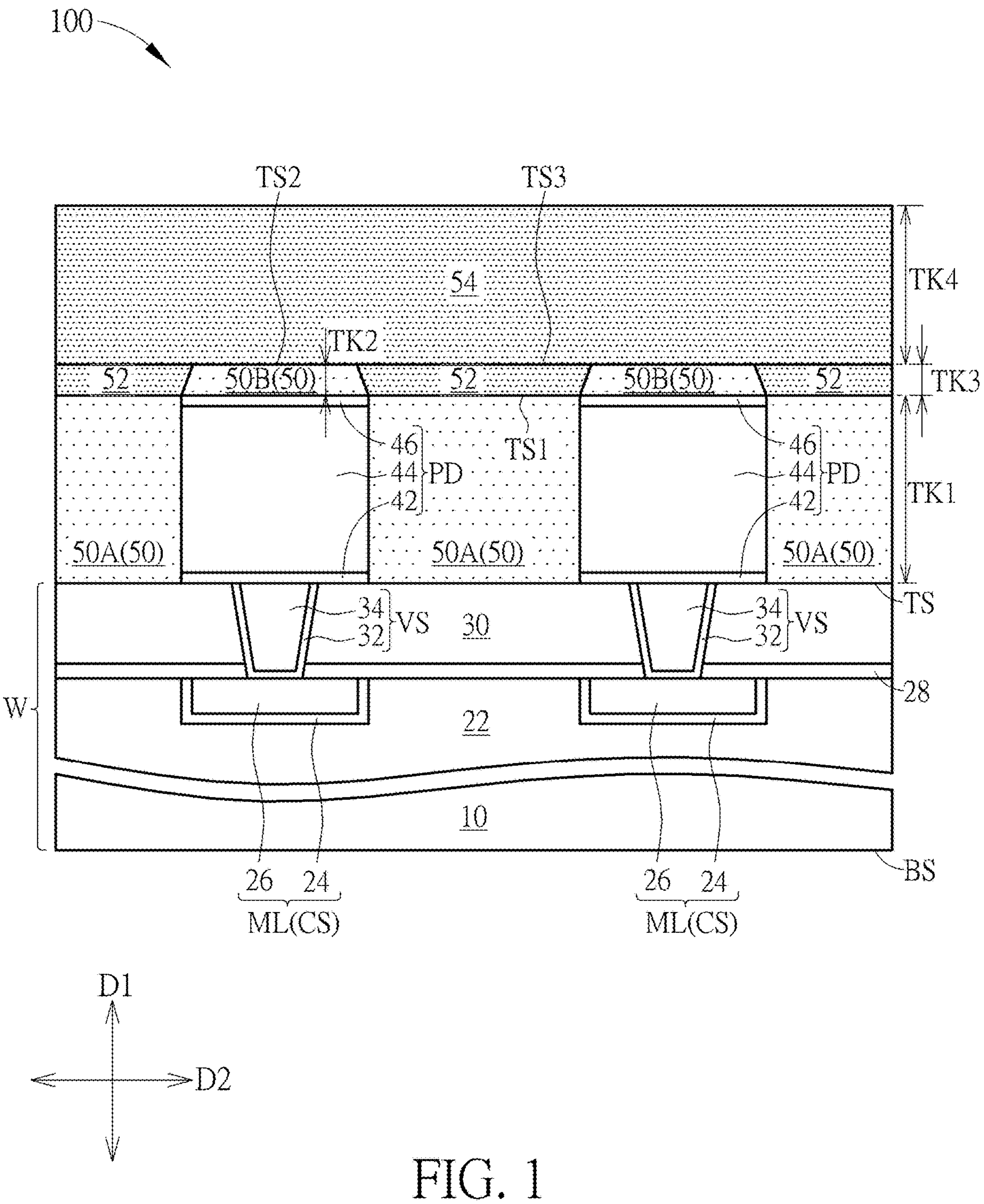
FIG. 1 is a schematic drawing illustrating a semiconductor device according to an embodiment of the present invention.

Please refer to FIG. 1. FIG. 1 is a schematic drawing illustrating a semiconductor device 100 according to an embodiment of the present invention. As shown in FIG. 1, the semiconductor device 100 includes a semiconductor substrate W, pad structures PD, a filling dielectric layer 50, a first compressive stress layer 52, and a second compressive stress layer 54. The pad structures PD are disposed on the semiconductor substrate W. The filling dielectric layer 50 is disposed on the semiconductor substrate W, and the filling dielectric layer 50 covers the pad structures PD. The filling dielectric layer 50 includes a first portion 50A and a second portion 50B. The first portion 50A is disposed between the pad structures PD in a horizontal direction D2, and the second portion 50B is disposed above the pad structures PD in a vertical direction D1. The first compressive stress layer 52 is disposed on the first portion 50A of the filling dielectric layer 50, and a top surface TS3 of the first compressive stress layer 52 and a top surface TS2 of the second portion 50B of the filling dielectric layer 50 are coplanar. The second compressive stress layer 54 is disposed on the first compressive stress layer 52 and the second portion 50B of the filling dielectric layer 50. A thickness TK4 of the second compressive stress layer 54 is greater than a thickness TK2 of the second portion 50B of the filling dielectric layer 50. The two compressive stress layers are disposed and the thickness TK4 of the second compressive stress layer 54 is greater than the thickness TK2 of the second portion 50B of the filling dielectric layer 50 for relatively increasing the proportion of the compressive stress material in the material layer located above the pad structures PD, and the warpage issue may be improved accordingly.

In some embodiments, the vertical direction D1 described above may be regarded as a thickness direction of the semiconductor substrate W, the semiconductor substrate W may have a top surface TS and a bottom surface BS opposite to the top surface TS in the vertical direction D1, and the pad structures PD, the filling dielectric layer 50, the first compressive stress layer 52, and the second compressive stress layer 54 described above may be disposed at the side of the top surface TS. Horizontal directions substantially orthogonal to the vertical direction D1 (such as the horizontal direction D2 and other directions orthogonal to the vertical direction D1) may be substantially parallel with the top surface TS and/or the bottom surface BS of the semiconductor substrate W, but not limited thereto. In this description, a distance between the bottom surface BS of the semiconductor substrate W and a relatively higher location and/or a relatively higher part in the vertical direction D1 may be greater than a distance between the bottom surface BS of the semiconductor substrate W and a relatively lower location and/or a relatively lower part in the vertical direction D1. The bottom or a lower portion of each component may be closer to the bottom surface BS of the semiconductor substrate W in the vertical direction D1 than the top or upper portion of this component. Another component disposed above a specific component may be regarded as being relatively far from the bottom surface BS of the semiconductor substrate W in the vertical direction D1, and another component disposed under a specific component may be regarded as being relatively close to the bottom surface BS of the semiconductor substrate W in the vertical direction D1. Additionally, in this description, a top surface and a top portion of a specific component may include the topmost surface and the topmost portion of this component in the vertical direction D1, respectively, and a bottom surface and a bottom portion of a specific component may include the bottommost surface and the bottommost portion of this component in the vertical direction D1, respectively. In this description, the condition that a certain component is disposed between two other components in a specific direction may include a condition that the certain component is sandwiched between the two other components in the specific direction. In addition, a thickness of a specific component in this description is generally a thickness of the specific component in the vertical direction D1, unless an addition description is accompanied.

In some embodiments, the semiconductor substrate W may include a substrate 10, a dielectric layer 22, an interconnection structure CS, a dielectric layer 28, a dielectric layer 30, and via conductors VS. The substrate 10 may include a silicon substrate or a substrate made of other suitable semiconductor materials or non-semiconductor materials. The dielectric layer 22 is disposed on the substrate 10, the interconnection structure CS is disposed in the dielectric layer 22, the dielectric layer 30 is disposed above the dielectric layer 22 and the interconnection structure CS, and the dielectric layer 28 is disposed between the dielectric layer 30 and the dielectric layer 22. The dielectric layer 22, the dielectric layer 28, and the dielectric layer 30 may include an oxide dielectric material (such as silicon oxide), a nitride dielectric material (such as silicon nitride), and carbide dielectric material (such as silicon carbide), a low dielectric constant (low-k) dielectric material (such as a dielectric material having dielectric constant lower than 2.7, but not limited thereto), or other suitable dielectric materials. The interconnection structure CS may include a plurality of electrically conductive lines (such as electrically conductive lines ML) and a plurality of via conductors alternately disposed in the vertical direction D1 for forming the required connection paths. In some embodiments, the electrically conductive line ML may be regarded as the electrically conductive line located at the topmost layer in the interconnection structure CS, the via conductor VS may penetrate through the dielectric layer 30 and the dielectric layer 28, and each of the pad structures PD may be electrically connected with the interconnection structure CS through the corresponding via conductor VS.

In some embodiments, some active components (such as transistors, diodes and so forth), passive components (such as capacitors, resistors and so forth), and/or other related circuits may be disposed on the substrate 10, and the pad structures PD may be electrically connected to the components and/or the circuits on the substrate 10 via the interconnection structure CS. In some embodiments, the semiconductor substrate W may include an image signal processor (ISP) or a semiconductor structure with other functions, and the pad structure PD may be regarded as the top metal electrically conductive structure formed on the image signal processor structure or other semiconductor structures. In addition, the thickness of the pad structure PD may be apparently greater than that of the electrically conductive line ML. For example, the thickness of the pad structure PD may be about 13,000 angstroms, but not limited thereto. In some embodiments, the electrically conductive line ML may include a barrier layer 24 and an electrically conductive material 26 disposed on the barrier layer 24, the via conductor VS may include a barrier layer 32 and an electrically conductive material 34 disposed on the barrier layer 32, and the pad structure PD may include a barrier layer 42, a barrier layer 46, and an electrically conductive material 44 disposed between the barrier layer 42 and the barrier layer 46, but not limited thereto. The barrier layer 24, the barrier layer 32, the barrier layer 42, and the barrier layer 46 may include titanium nitride, tantalum nitride, or other suitable electrically conductive barrier materials. The electrically conductive material 26, the electrically conductive material 34, and the electrically conductive material 44 may include a material with relatively low electrical resistivity, such as copper, aluminum, tungsten and so forth.

Because the pad structure PD is relatively thick, the filling dielectric layer 50 with better gap-filling performance is required for filling the space between the pad structures PD. For example, the filling dielectric layer 50 may be formed by a high density plasma (HDP) deposition process, but not limited thereto. The high density plasma deposition may include a high density chemical vapor deposition (HDP-CVD) process or other suitable deposition approaches, and the filling dielectric layer 50 may include a high density plasma (HDP) oxide dielectric material or other suitable filling dielectric materials. The first compressive stress layer 52 and the second compressive stress layer 54 may include a material capable of providing greater compressive stress, such as tetraethoxysilane (TEOS) oxide or other suitable high compressive stress materials. In some embodiments, the TEOS oxide may be formed by a chemical vapor deposition process, such as a plasma-enhanced CVD (PECVD), but not limited thereto. Because the gap-filling performance of the TOES oxide formed by PECVD is relatively poor, the filling dielectric layer 50 may be used to cover the pad structures PD first, and the first compressive stress layer 52 and the second compressive stress layer 54 with greater compressive stress may then be formed for improving the warpage issue. Therefore, a compressive stress of the first compressive stress layer 52 may be greater than a compressive stress of the filling dielectric layer 50, and a compressive stress of the second compressive stress layer 54 may be greater than the compressive stress of the filling dielectric layer 50. For example, a compressive stress of the high density plasma oxide dielectric material described above may be about −136 MPa, and a compressive stress of the TEOS oxide material described above may be about −370 MPa, but not limited thereto. It is worth noting that, the value of compressive stress is generally negative to indicate that the object is squeezed, and in this description, when comparing the compressive stress of two different materials and/or layers, the comparison is made in terms of their absolute values.

In some embodiments, the thickness TK2 of the second portion 50B of the filling dielectric layer 50 may be reduced for relatively increasing the proportion of the high compressive stress material in the material layer located above the pad structure PD. Therefore, the thickness TK4 of the second compressive stress layer 54 may be greater than a thickness TK3 of the first compressive stress layer 52 and the thickness TK2 of the second portion 50B of the filling dielectric layer 50, respectively, and a thickness TK1 of the first portion 50A of the filling dielectric layer 50 may be greater than the thickness TK2 of the second portion 50B of the filling dielectric layer 50 and the thickness TK3 of the first compressive stress layer 52, respectively. In some embodiments, for reducing the overall thickness of the materials layers located above the pad structure PD, the thickness TK1 of the first portion 50A of the filling dielectric layer 50 may be greater than the thickness TK4 of the second compressive stress layer 54, and the thickness TK1 of the first portion 50A of the filling dielectric layer 50 may be greater than a sum of the thickness TK4 of the second compressive stress layer 54 and the thickness TK3 of the first compressive stress layer 52, but not limited thereto.

In some embodiments, the first portion 50A of the filling dielectric layer 50 may directly contact the pad structures PD and the top surface TS of the semiconductor substrate W, a top surface TS1 of the first portion 50A of the filling dielectric layer 50 may be lower than the top surface TS2 of the second portion 50B of the filling dielectric layer 50 in the vertical direction D1, the top surface TS1 may be slightly higher than the top surface of the pad structure PD in the vertical direction D1 or the top surface TS1 and the top surface of the pad structure PD may be substantially coplanar, and the first portion 50A of the filling dielectric layer 50 may be directly connected with the second portion 50B of the filling dielectric layer 50, but not limited thereto. The second portion 50B of the filling dielectric layer 50 may directly contact the top surface of the pad structure PD, the first compressive stress layer 52 may directly contact the first portion 50A and the second portion 50B of the filling dielectric layer 50, and the second compressive stress layer 54 may directly contact the first compressive stress layer 52 and the second portion 50B of the filling dielectric layer 50.

In some embodiments, a material composition of the first compressive stress layer 52 may be identical to a material composition of the second compressive stress layer 54. For example, the material of the first compressive stress layer 52 and the material of the second compressive stress layer 54 may be the TEOS oxide material described above, but not limited thereto. In addition, even if the material compositions are the same, the compressive stress will be influence when the manufacturing methods and/or the forming process conditions are different. For example, the film quality of the TEOS oxide material will be influenced when the deposition rate is relatively high, and the compressive stress provided by the TEOS oxide material will be reduced accordingly. However, the proportion of the first compressive stress layer 52 in the material layers located above the pad structure PD is relatively low, and the slight reduction in compressive stress provided by the first compressive stress layer 52 has less impact on the effect provided by the overall compressive stress material. Therefore, the first compressive stress layer 52 may be formed by a process with higher deposition rate for reducing the manufacturing process time. In this situation, the compressive stress of the second compressive stress layer 54 may be greater than the compressive stress of the first compressive stress layer 52.

Figure 2:
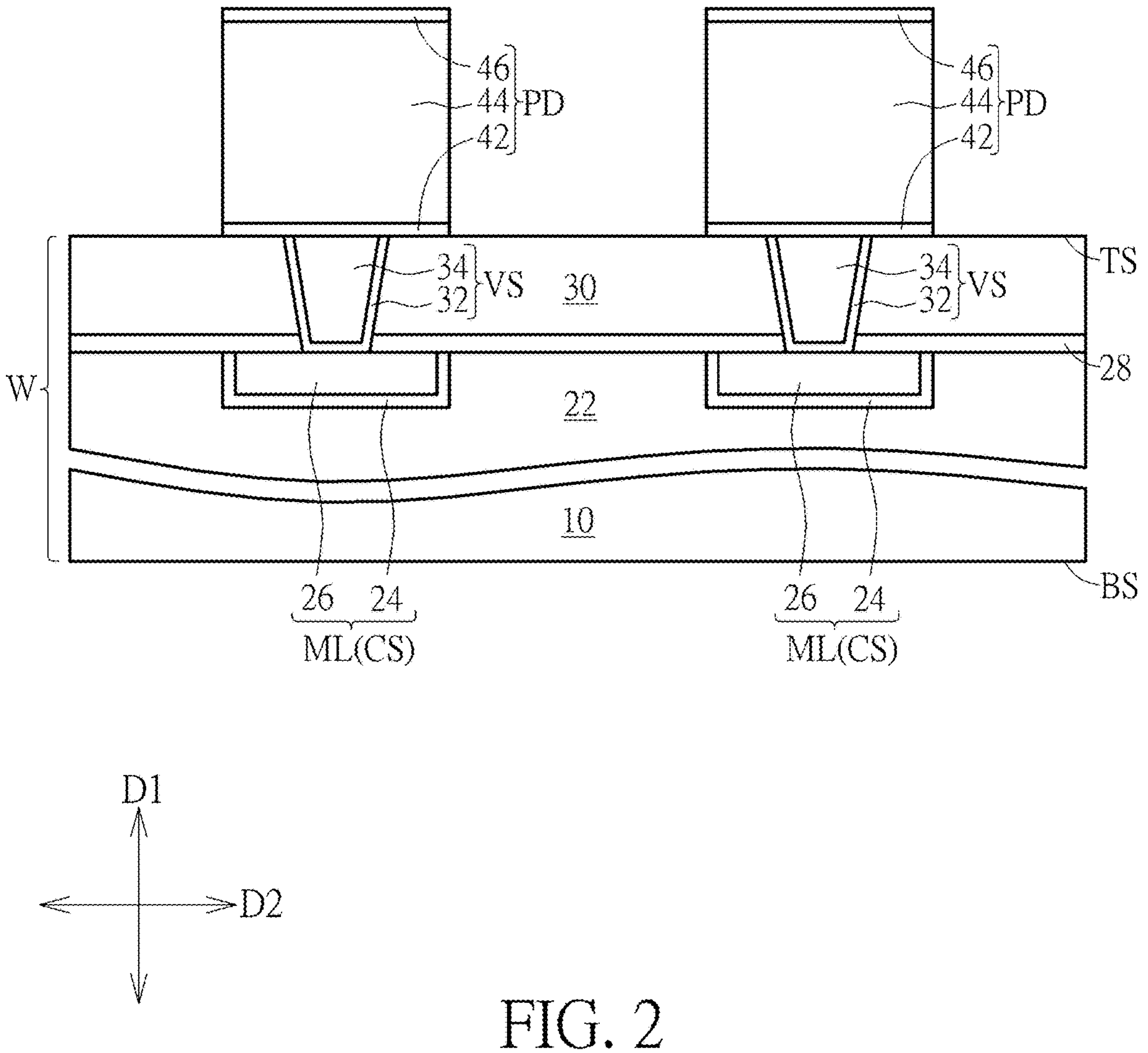
Figure 3:
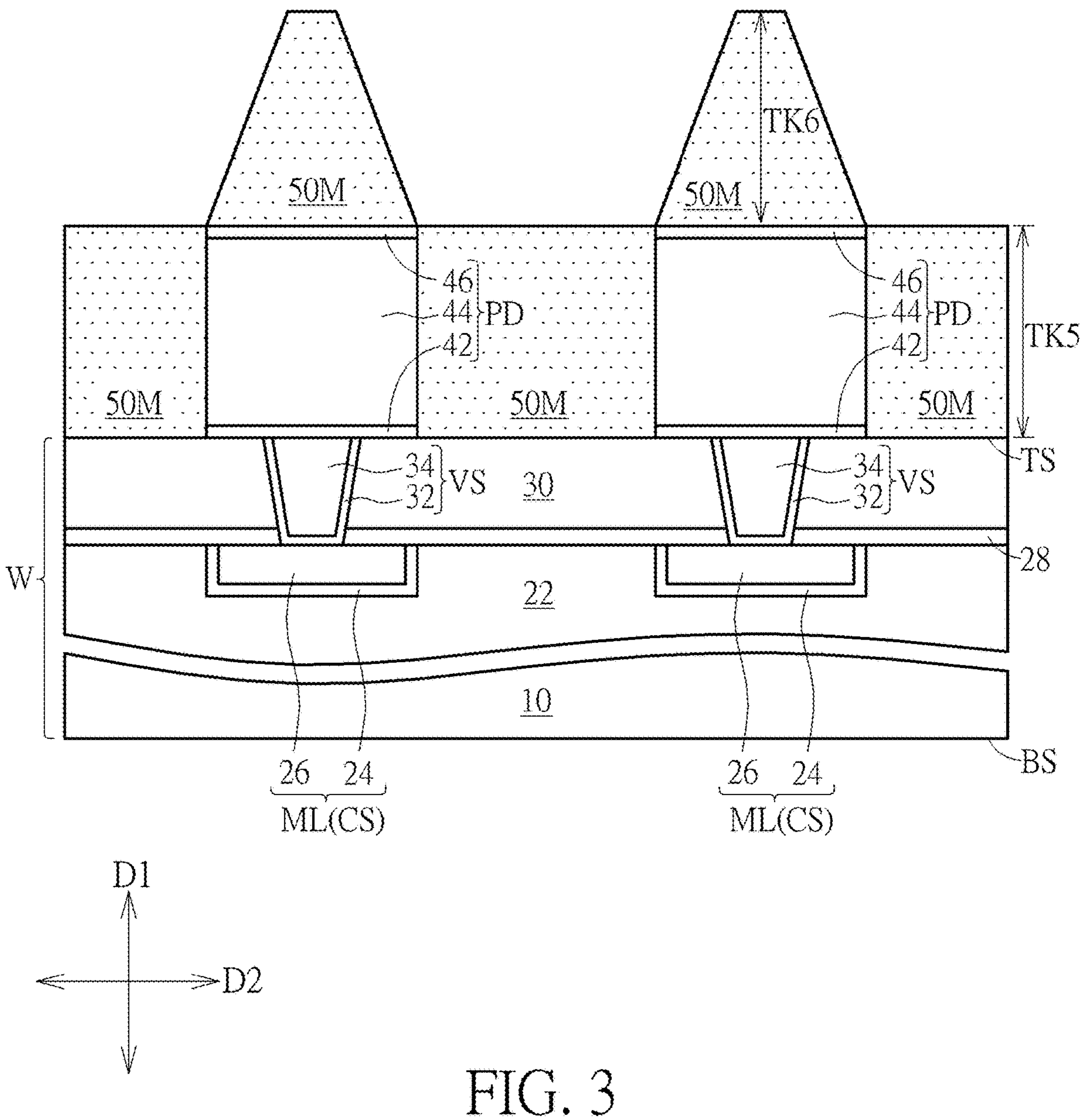
Figure 4:
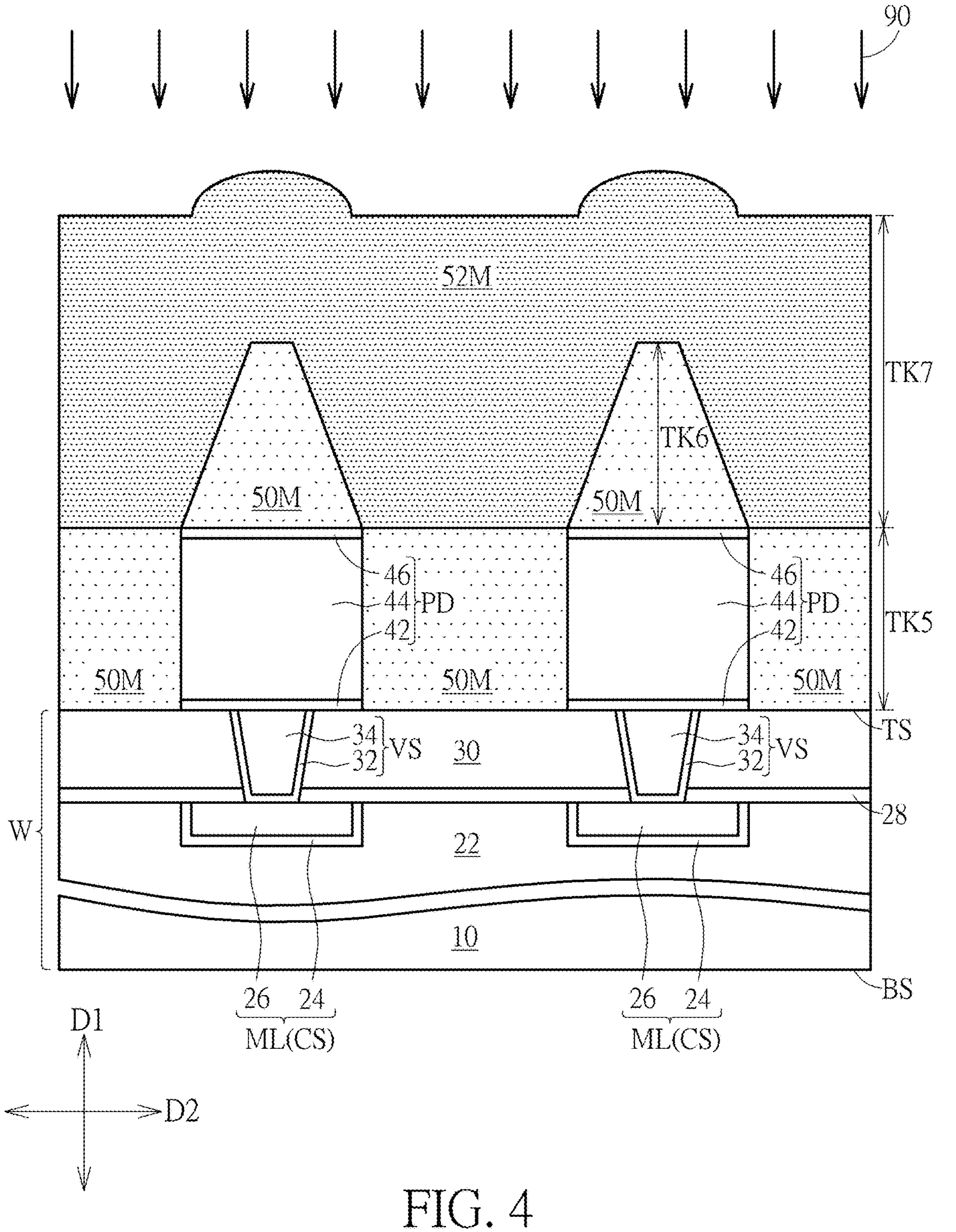
Figure 5:
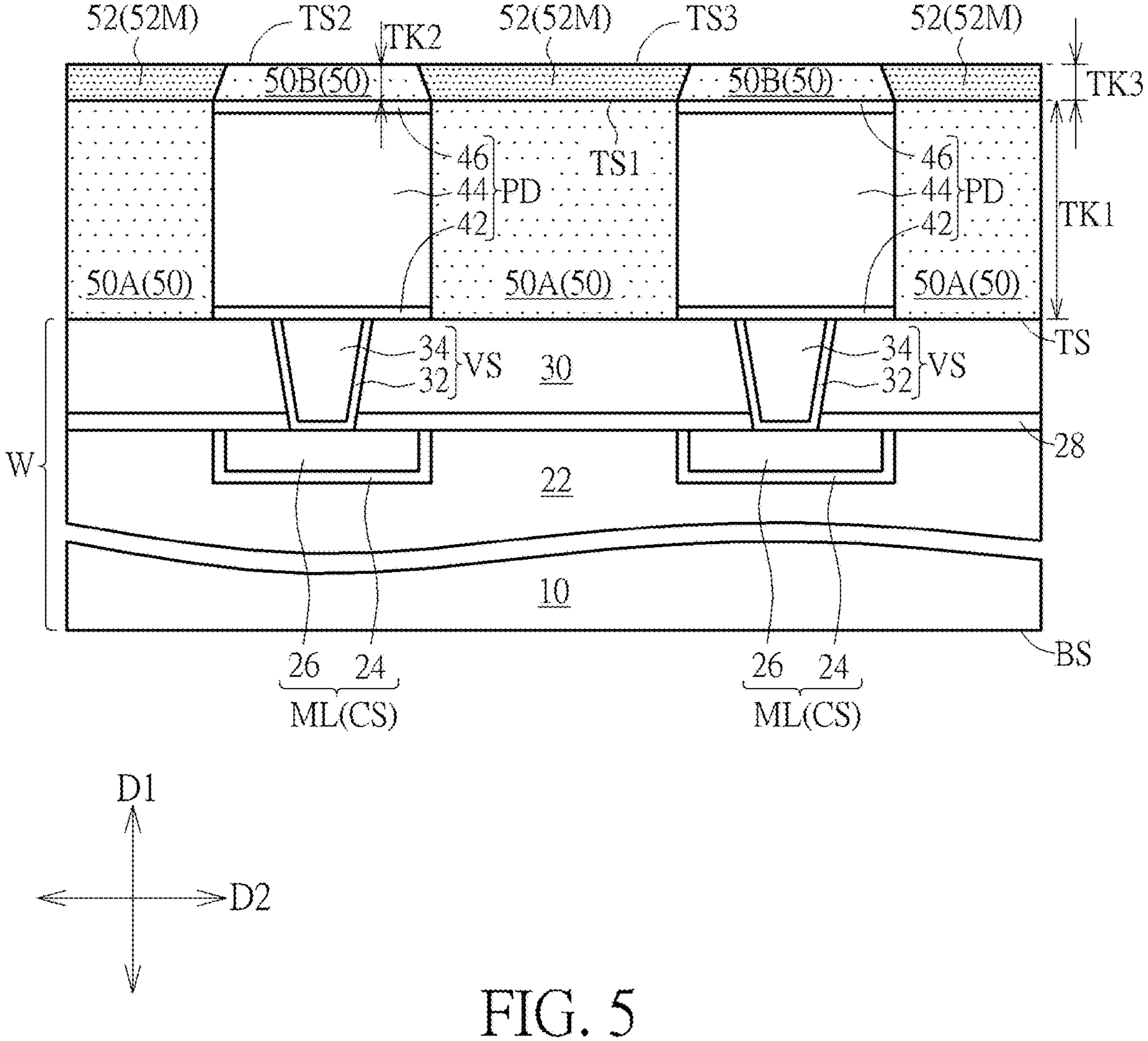

Please refer to FIGS. 1-5. FIGS. 2-5 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. In some embodiments, FIG. 1 may be regarded as a schematic drawing in a step subsequent to FIG. 5, but not limited thereto. As shown in FIG. 1, the manufacturing method in this embodiment may include the following steps. Firstly, the semiconductor substrate W is provided, and the pad structures PD are formed on the semiconductor substrate W. The filling dielectric layer 50 and the first compressive stress layer 52 are formed on the semiconductor substrate W. The filling dielectric layer 50 covers the pad structures PD, and the filling dielectric layer 50 includes the first portion 50A and the second portion 50B. The first portion 50A is disposed between the pad structures PD in the horizontal direction D2, and the second portion 50B is disposed above the pad structures PD in the vertical direction D1. The first compressive stress layer 52 is located on the first portion 50A of the filling dielectric layer 50, and the top surface TS3 of the first compressive stress layer 52 and the top surface TS2 of the second portion 50B of the filling dielectric layer 50 are coplanar. The second compressive stress layer 54 is formed on the first compressive stress layer 52 and the second portion 50B of the filling dielectric layer 50. The thickness TK4 of the second compressive stress layer 54 is greater than the thickness TK2 of the second portion 50B of the filling dielectric layer 50.

Specifically, the manufacturing method in this embodiment may include but is not limited to the following steps. As shown in FIG. 2, the plurality of the pad structures PD may be formed on the semiconductor substrate W, and each of the pad structures PD may include the barrier layer 42, the electrically conductive material 44, and the barrier layer 46 described above, but not limited thereto. Subsequently, as shown in FIG. 3, a filling dielectric material 50M may be formed on the semiconductor substrate W. The filling dielectric material 50M covers the pad structures PD, a portion of the filling dielectric material 50M is located between the pad structures PD in the horizontal direction D2, and another portion of the filling dielectric material 50M is located above the pad structures PD in the vertical direction D1. In some embodiments, the filling dielectric material 50M may be formed by the high density plasma deposition process, and because of the characteristics of this deposition process, a thickness TK6 of the filling dielectric material 50M located above the pad structures PD in the vertical direction D1 may be substantially equal to a thickness TK5 of the filling dielectric material 50M located between the pad structures PD in the horizontal direction D2, but not limited thereto. Subsequently, as shown in FIG. 4, a compressive stress material 52M may be formed on the filling dielectric material 50M, and a compressive stress of the compressive stress material 52M is greater than a compressive stress of the filling dielectric material 50M. In some embodiments, the compressive stress material 52M may include the TEOS oxide described above, and the compressive stress material 52M may be formed by chemical vapor deposition, such as plasma-enhanced chemical vapor deposition, but not limited thereto.

As shown in FIG. 4 and FIG. 5, a planarization process 90 may be performed to the compressive stress material 52M and the filling dielectric material 50M located above the pad structures PD in the vertical direction D1 for removing a part of the compressive stress material 52M and a part of the filling dielectric material 50M located above the pad structures PD in the vertical direction D1. The planarization process 90 may include a chemical mechanical polishing (CMP) process or other suitable planarization approaches. After the planarization process 90, a part of the compressive stress material 52M and a part of the filling dielectric material 50M may remain above the semiconductor substrate W. The compressive stress material 52M remaining above the semiconductor substrate W after the planarization process 90 becomes the first compressive stress layer 52, and the filling dielectric material 50M remaining above the semiconductor substrate W after the planarization process 90 becomes the filling dielectric layer 50. In addition, the filling dielectric material 50M located between the pad structures PD in the horizontal direction D2 is covered by the compressive stress material 52M during the planarization process 90 without being partially removed by the planarization process 90, and the filling dielectric material 50M located between the pad structures PD in the horizontal direction D2 may be regarded as the first portion 50A of the filling dielectric layer 50 described above. It is worth noting that, a method of forming the filling dielectric layer 50 and the first compressive stress layer 52 in this embodiment may include but is not limited to the steps shown in FIGS. 3-5. In other words, the filling dielectric layer 50 and the first compressive stress layer 52 described above may be formed by other suitable approaches according to some design considerations also.

As shown in FIG. 4 and FIG. 5, in some embodiments, the thickness TK6 of the filling dielectric material 50M located above the pad structures PD in the vertical direction D1 before the planarization process 90 may be greater than the thickness TK2 of the second portion 50B of the filling dielectric layer 50, and a thickness TK7 of the compressive stress material 52M before the planarization process 90 may be greater than the thickness TK6 of the filling dielectric material 50M located above the pad structures PD in the vertical direction D1 before the planarization process 90. The thickness TK7 may be regarded as a thickness of the compressive stress material 52M without overlapping the pad structures PD in the vertical direction D1 and/or the maximum thickness of the compressive stress material 52M, but not limited thereto. Additionally, in some embodiments, because of the influence of the high density plasma deposition process for forming the filling dielectric material 50M, the filling dielectric material 50M located above each pad structure PD in the vertical direction D1 may have a trapezoid structure in the cross-section diagram, and it is easier to fill the gaps between the adjacent trapezoidal structures with the compressive stress material 52M accordingly, but not limited thereto. As shown in FIG. 4, FIG. 5, and FIG. 1, the second compressive stress 54 may be formed after the planarization process 90 for forming the semiconductor device 100.

In some embodiments, the planarization process 90 described above may be used to control the thickness TK2 of the second portion 50B of the filling dielectric layer 50, and the thickness TK2 of the second portion 50B of the filling dielectric layer 50 may be reduced as much as possible under the condition that the filling dielectric material 50M is retained on the pad structures PD for keeping the protective effect. The proportion of the high compressive stress material in the material layers located above the pad structures PD may be increased according for improving the warpage issue and/or the thickness of the material layers located above the pad structures PD may be reduced accordingly, and the influence of the material layers disposed above the pad structures PD on the overall thickness of the semiconductor device 100 may be reduced.

To summarize the above descriptions, according to the semiconductor device and the manufacturing method thereof in the present invention, the planarization process may be performed to the filling dielectric material and the compressive stress material, and another compressive stress layer may be formed after the planarization process for improving the warpage issue of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a semiconductor substrate;

pad structures disposed on the semiconductor substrate;

a filling dielectric layer disposed on the semiconductor substrate, wherein the filling dielectric layer covers the pad structures, and the filling dielectric layer comprises:

a first portion disposed between the pad structures in a horizontal direction; and a second portion disposed above the pad structures in a vertical direction;

a first compressive stress layer disposed on the first portion of the filling dielectric layer, wherein a top surface of the first compressive stress layer and a top surface of the second portion of the filling dielectric layer are coplanar; and a second compressive stress layer disposed on the first compressive stress layer and the second portion of the filling dielectric layer, wherein a thickness of the second compressive stress layer is greater than a thickness of the second portion of the filling dielectric layer, the first compressive stress layer directly contacts the first portion and the second portion of the filling dielectric layer, and the second compressive stress layer directly contacts the first compressive stress layer and the second portion of the filling dielectric layer.

2. The semiconductor device according to claim 1, wherein a compressive stress of the first compressive stress layer is greater than a compressive stress of the filling dielectric layer.

3. The semiconductor device according to claim 1, wherein a compressive stress of the second compressive stress layer is greater than a compressive stress of the filling dielectric layer.

4. The semiconductor device according to claim 1, wherein a compressive stress of the second compressive stress layer is greater than a compressive stress of the first compressive stress layer.

5. The semiconductor device according to claim 1, wherein the thickness of the second compressive stress layer is greater than a thickness of the first compressive stress layer.

6. The semiconductor device according to claim 1, wherein a thickness of the first portion of the filling dielectric layer is greater than the thickness of the second portion of the filling dielectric layer.

7. The semiconductor device according to claim 1, wherein a thickness of the first portion of the filling dielectric layer is greater than the thickness of the second compressive stress layer.

8. The semiconductor device according to claim 1, wherein a thickness of the first portion of the filling dielectric layer is greater than a sum of the thickness of the second compressive stress layer and a thickness of the first compressive stress layer.

9. The semiconductor device according to claim 1, wherein a material composition of the first compressive stress layer is identical to a material composition of the second compressive stress layer.

10. The semiconductor device according to claim 1, wherein a top surface of the first portion of the filling dielectric layer is lower than the top surface of the second portion of the filling dielectric layer in the vertical direction.

11. The semiconductor device according to claim 1, wherein the semiconductor substrate comprises an interconnection structure, and each of the pad structures is electrically connected with the interconnection structure.

12. A manufacturing method of a semiconductor device, comprising:

providing a semiconductor substrate;

forming pad structures on the semiconductor substrate;

forming a filling dielectric layer and a first compressive stress layer on the semiconductor substrate, wherein the filling dielectric layer covers the pad structures, and the filling dielectric layer comprises:

a first portion disposed between the pad structures in a horizontal direction; and a second portion disposed above the pad structures in a vertical direction, wherein the first compressive stress layer is located on the first portion of the filling dielectric layer, and a top surface of the first compressive stress layer and a top surface of the second portion of the filling dielectric layer are coplanar; and forming a second compressive stress layer on the first compressive stress layer and the second portion of the filling dielectric layer, wherein a thickness of the second compressive stress layer is greater than a thickness of the second portion of the filling dielectric layer, the first compressive stress layer directly contacts the first portion and the second portion of the filling dielectric layer, and the second compressive stress layer directly contacts the first compressive stress layer and the second portion of the filling dielectric layer.

13. The manufacturing method of the semiconductor device according to claim 12, wherein a method of forming the filling dielectric layer and the first compressive stress layer comprises:

forming a filling dielectric material on the semiconductor substrate, wherein the filling dielectric material covers the pad structures, a portion of the filling dielectric material is located between the pad structures in the horizontal direction, and another portion of the filling dielectric material is located above the pad structures in the vertical direction;

forming a compressive stress material on the filling dielectric material; and performing a planarization process to the compressive stress material and the filling dielectric material located above the pad structures in the vertical direction for removing a part of the compressive stress material and a part of the filling dielectric material located above the pad structures in the vertical direction.

14. The manufacturing method of the semiconductor device according to claim 13, wherein the compressive stress material remaining above the semiconductor substrate after the planarization process becomes the first compressive stress layer, and the filling dielectric material remaining above the semiconductor substrate after the planarization process becomes the filling dielectric layer.

15. The manufacturing method of the semiconductor device according to claim 13, wherein a thickness of the filling dielectric material located above the pad structures in the vertical direction before the planarization process is greater than the thickness of the second portion of the filling dielectric layer, and a thickness of the compressive stress material before the planarization process is greater than the thickness of the filling dielectric material located above the pad structures in the vertical direction before the planarization process.

16. The manufacturing method of the semiconductor device according to claim 13, wherein the second compressive stress is formed after the planarization process.

17. The manufacturing method of the semiconductor device according to claim 13, wherein a compressive stress of the compressive stress material is greater than a compressive stress of the filling dielectric material.

18. The manufacturing method of the semiconductor device according to claim 13, wherein the filling dielectric material is formed by a high density plasma (HDP) deposition process.

19. The manufacturing method of the semiconductor device according to claim 12, wherein a compressive stress of the second compressive stress layer is greater than a compressive stress of the first compressive stress layer.

* * * * *